(12) United States Patent
Bedell et al.

(10) Patent No.: US 7,892,945 B2
(45) Date of Patent: Feb. 22, 2011

(54) NANOWIRE MESH DEVICE AND METHOD OF FABRICATING SAME

(75) Inventors: Stephen W. Bedell, Wappingers Falls, NY (US); Josephine B. Chang, Mahopac, NY (US); Paul Chang, Mahopac, NY (US); Michael A. Guillorn, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/848,582

(22) Filed: Aug. 2, 2010

(65) Prior Publication Data

US 2010/0297816 A1 Nov. 25, 2010

Related U.S. Application Data

(62) Division of application No. 12/371,943, filed on Feb. 17, 2009.

(51) Int. Cl.
*H01L 21/76* (2006.01)
(52) U.S. Cl. .................. 438/445; 438/551; 438/555; 438/671
(58) Field of Classification Search .............. 438/445, 438/551, 555, 671
See application file for complete search history.

(56) References Cited

U.S. PATENT DOCUMENTS

| 6,642,119 | B1 | 11/2003 | Pelella et al. |
| 2006/0091481 | A1 | 5/2006 | Li et al. |
| 2006/0216897 | A1 | 9/2006 | Lee et al. |
| 2007/0004124 | A1 | 1/2007 | Suk et al. |
| 2007/0017439 | A1 | 1/2007 | Xianyu et al. |
| 2008/0099849 | A1 | 5/2008 | Kim et al. |
| 2008/0102586 | A1 | 5/2008 | Park |

OTHER PUBLICATIONS

Cho, K., et al., "Observation of Single Electron Tunneling and Ballistic in Twin Silicon Nanowire MOSFETS (TSNWFETS) Fabricated by Top-Down CMOS Process", 2006 IEEE.

*Primary Examiner*—Tan N Tran
(74) *Attorney, Agent, or Firm*—Scully, Scott, Murphy & Presser, P.C.; H. Daniel Schnurmann (57) ABSTRACT

A semiconductor structure is provided that includes a plurality of vertically stacked and vertically spaced apart semiconductor nanowires (e.g., a semiconductor nanowire mesh) located on a surface of a substrate. One end segment of each vertically stacked and vertically spaced apart semiconductor nanowires is connected to a source region and another end segment of each vertically stacked and vertically spaced apart semiconductor nanowires is connected to a drain region. A gate region including a gate dielectric and a gate conductor abuts the plurality of vertically stacked and vertically spaced apart semiconductor nanowires, and the source regions and the drain regions are self-aligned with the gate region.

13 Claims, 9 Drawing Sheets

NANOWIRE MESH DEVICE AND METHOD OF FABRICATING SAME

CROSS REFERENCE TO RELATED APPLICATION

This application is a divisional of U.S. patent application Ser. No. 12/371,943, filed Feb. 17, 2009 the entire content and disclosure of which is incorporated herein by reference.

FIELD OF THE INVENTION

The present invention relates to a semiconductor structure and a method of fabricating the same. More particularly, the present invention relates to a semiconductor structure including a plurality of vertically stacked and vertically spaced apart semiconductor nanowires and to a method of fabricating such a semiconductor structure.

BACKGROUND OF THE INVENTION

Due to their superior electrostatics gate-all-around nanowire channel field effect transistors (e.g., nanowire FETs) are expected to enable density scaling beyond current planar CMOS technology. In its basic form, a nanowire FET includes a source, a drain and one or more nanowire channels between the source and the drain. A gate electrode, which wraps around the one or more nanowire channels, regulates electron flow through the nanowire channel between the source and drain.

The architecture of a nanowire FET, however, presents notable fabrication challenges. "Bottom-up" nanowire devices built from "grown" nanowires may provide a channel surface with fewer defects, while "top-down" nanowire devices built by patterning and etching bulk materials offer the advantage of deterministic size and placement of nanowires. Currently, the top-down approach is the only method that is feasible for making nanowire FETs at high layout density, since deterministic placement is a prerequisite for high density circuits. However, even with deterministic placement, fabrication of nanowires at very tight gate pitch and a high density of a current-carrying surface are challenging. Scaled gate pitch demands gates which are self-aligned to the source contact region and the drain contact region; a high density of a current carrying surface requires that nanowires be placed very close together or stacked. Previous demonstrations of nanowire FETs are all primarily at relaxed layout density, allowing these problems to be sidestepped.

Scaled gate pitch makes contacting nanowires difficult. One common method for contacting top-down patterned nanowires is to use a large silicon source/drain landing pad which is connected to multiple nanowires. Landing pads provide mechanical stability during processing, simplify the device contacting scheme and can reduce external resistance. However, the landing pads have to be precisely aligned with the gate in order to achieve a highly scaled gate pitch (in the case of logic layouts using minimum gate pitch) and to minimize variations in extrinsic resistance and parasitic capacitance. Properly and consistently aligning the landing pads with the gate is nearly impossible at required gate pitches unless a self-aligned scheme is utilized. As a result, alternate schemes that do not use landing pads have been proposed. Simply eliminating landing pads results in nanowire source/drain regions. In this case, each nanowire in the source/drain region has to be individually contacted. Because nanowires are expected to be at a smaller pitch than contact vias for a high layout density technology, nanowire source/drain regions need to be contacted by contact bars; contact bars introduce greater complexity in patterning and typically require the insertion of an extra mask layer between the contact bars and the first metal layer.

Epitaxially merged source/drain regions is another solution that has been proposed for contacting multiple nanowires. Epitaxial processes, however, have drawbacks due to their extreme sensitivity to surface chemistry, crystal orientation and growth conditions. For example, with an epitaxial growth process, parasitic growth on the gate has to be prevented, the rest of the device structure has to be protected from aggressive pre-epitaxial cleans, and the faceting and direction of the epitaxial growth has to be controlled to minimize both parasitic capacitance and resistance and to achieve similar growth on differently doped source and drain surfaces.

Achieving a high density of a current carrying surface is the other challenge of making high layout density nanowire FETs. As the diameter of nanowires is reduced to enable better electrostatics, the current carrying surface (or area, in the case of bulk inversion) of each nanowire is reduced as well, meaning that more nanowires need to be placed in closer proximity to each other to achieve the same density of the current carrying surface or area. For example, nanowires with a diameter of 4 nm would need to be placed at a pitch of 12 nm to yield the same effective width as a planar device with the same layout footprint. One way to increase layout density in the width direction is to stack the nanowires vertically, rather than using just one layer of them. This is a solution that is unique to gate-all-around devices such as nanowire FETs.

Cho et al., "Observation of Single Electron Tunneling and Ballistic in Twin Silicon Nanowire MOSFETS (TSN-WFETS) Fabricated by Top-Down CMOS Process", 2006 IEEE discloses a nanowire FET structure including two silicon nanowires that are spaced apart from each other in the horizontal direction. Specifically, Cho et al. discloses a horizontally spaced apart twin nanowire-containing FinFET that does not use advanced lithography. The current carrying density of the horizontally spaced apart twin nanowire-containing structure provided in Cho et al. is limited and, as further scaling continues, a further decrease in current carrying density will be observed using the structure provided in Cho et al.

Therefore, a nanowire FET structure and a method for fabrication thereof that improves the device's contacting scheme and scalability, while increasing the device's current carrying density would be desirable.

SUMMARY OF THE INVENTION

The present invention provides a semiconductor structure, e.g., a nanowire FET structure, which has an improved contact scheme and scalability. Moreover, and in conjunction with these improvements, the present invention provides a semiconductor structure in which the current carrying density is increased. Also, the inventive structure has improved vertical uniformity in junction profiles. As such, the height of the inventive structure (i.e., the number of stacked semiconductor nanowires) is not limited by the ability to define source and drain junctions from a top-down implant. It is yet further observed that the inventive structure has reduced gate-to-source/drain capacitance as compared to prior art FinFET structures since during the inventive process a thin, self-limiting interfacial oxide is typically formed on undoped semiconductor nanowires.

In one aspect of the invention, a semiconductor structure is provided that includes a plurality of vertically stacked and vertically spaced apart semiconductor nanowires (e.g., a nanowire mesh) located on a surface of a substrate, each semiconductor nanowire having two end segments in which one of the end segments is connected to a source region and the other end segment is connected to a drain region. The inventive structure also contains a gate region including a gate dielectric and a gate conductor located over at least a portion of the plurality of vertically stacked and vertically spaced apart semiconductor nanowires. Each source region and each drain region within the inventive structure is self-aligned with the gate region.

In another aspect of the invention, a method of fabricating the aforementioned semiconductor structure is provided. The method of the present invention includes first providing a plurality of patterned hard masks atop a patterned material stack including alternating layers of semiconductor material and sacrificial material. The bottommost layer of the patterned material stack used in this step is a top semiconductor layer of a semiconductor substrate. At least one dummy gate is then formed over a central portion of each of the plurality of patterned hard masks. After dummy gate formation, a sacrificial material layer is formed abutting the at least one dummy gate. Next, the at least one dummy gate is removed to form a trench in the sacrificial material layer, centered over the central portion of the plurality of patterned hard masks, that distinguishes a nanowire channel region from source and drain regions. After dummy gate removal, the patterned material stack within the trench is etched using the plurality of patterned hard masks as an etch mask so as to provide a plurality of fins within the trench. Next, the plurality of patterned hard masks and each of the layers of sacrificial material is removed within the trench to form a plurality of vertically stacked and vertically spaced apart semiconductors nanowires. The trench is then filled with at least a gate region.

DETAILED DESCRIPTION OF THE INVENTION

The present invention, which provides a semiconductor structure including a plurality of vertically stacked and vertically spaced apart semiconductor nanowires (e.g., nanowire mesh) and a method of fabricating such a semiconductor structure, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is now made to FIGS. 1-10 of the present application which are pictorial representations depicting the basic processing flow of the present application. In the description and drawings that follow, one dummy gate is shown for illustrative purposes. Although a single dummy gate is shown, the inventive method can be employed in forming a plurality of dummy gates atop the substrate, which will ultimately provide a plurality of nanowire FETs.

Figure 1:
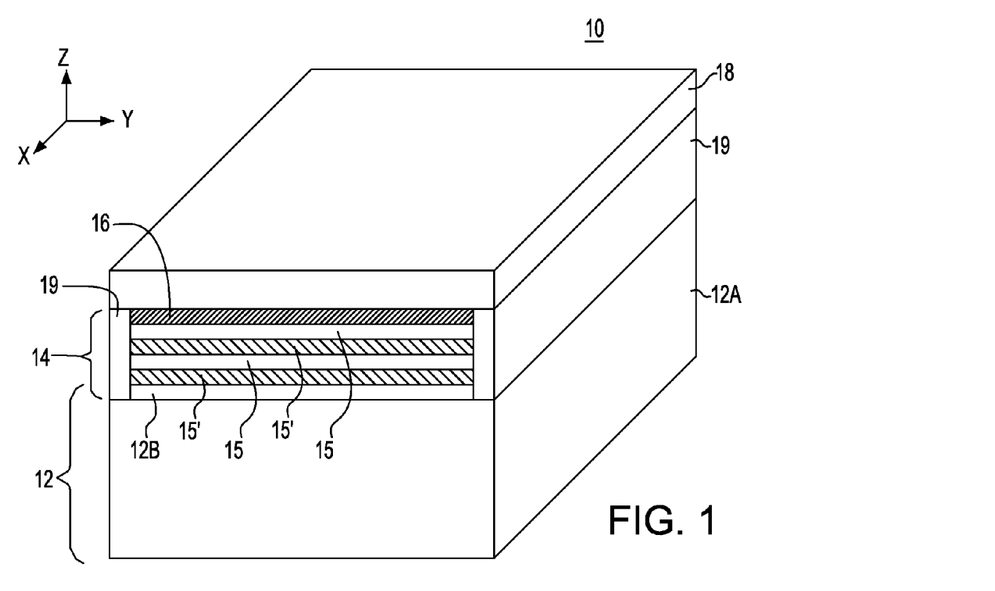
FIG. 1 is a pictorial representation (through a 3D view) illustrating an initial structure which includes at least one patterned material stack including alternating layers of semiconductor material and sacrificial material atop a buried insulating layer of a substrate that can be employed in the present invention.

The inventive process begins by first providing the initial structure 10 that is shown in FIG. 1. Specifically, FIG. 1 shows an initial structure 10 that includes a processed portion of a semiconductor-on-insulator (SOI) substrate 12 including a buried insulating layer 12A and a top semiconductor layer 12B; the bottom semiconductor layer of the SOI substrate 12 which is located beneath the buried insulating layer 12A, is not shown for clarity. As further shown, the top semiconductor layer 12B represents the bottommost layer of a patterned material stack 14 that includes a plurality of vertically stacked semiconductor layers that are vertically spaced apart by a plurality of layers of sacrificial material such as, for example, a doped SiGe alloy. In FIG. 1, the additional layers of semiconductor material of the patterned material stack 14 are designed as 15 and the layers of sacrificial material are designed as 15'. As stated above, the bottommost layer of the patterned stack is comprised of the top semiconductor layer 12B of the SOI substrate 12.

The initial structure 10 also includes a pad stack including, from bottom to top, a first hard mask 16 and a second hard mask 18 that are located atop the patterned material stack 14. Also shown is a nitride liner 19 that is located within an isolation trench that is formed into blanket layers of the first hard mask 16 and the patterned material stack 14 including the top semiconductor layer 12B. It is noted that the trench bottom stops atop an upper surface of the buried insulating layer 12A.

The initial structure 10 shown in FIG. 1 is formed by first providing a semiconductor-on-insulator (SOI) substrate 12 that includes a bottom semiconductor layer (not specifically shown), a buried insulating layer 12A and a top semiconductor layer 12B. The top semiconductor layer 12A of the SOI substrate 12 may comprise any semiconductor material including, for example, Si, SiGe, SiGeC, SiC, Ge alloys, GaAs, InAs, InP and other III/V and II/VI compound semiconductor. Typically, the top semiconductor layer 12B of the SOI substrate 12 is a Si-containing semiconductor material including one of Si, SiGe, SiGeC and SiC. More typically, the top semiconductor layer 12B of the SOI substrate 12 is comprised of silicon. The bottom semiconductor layer may also comprise any of the above mentioned semiconductor materials, with silicon be highly preferred.

The top semiconductor layer 12B of the SOI substrate 12 is a thin layer whose thickness is typically less than 100 nm, with commercially available SOI substrates having a top semiconductor layer whose thickness typically ranges from 30 nm to 90 nm. For this structure, the desired starting thickness range would typically fall below 20 nm, likely between 5 nm and 10 nm. This target thickness can be achieved by oxidative thinning of a thicker SOI substrate or by chemical mechanical planarization (CMP) and grinding.

The buried insulating layer 12A of the SOI substrate 12 may be comprised of a crystalline or non-crystalline oxide, nitride, oxynitride or any combination thereof, including a multilayered stack of such insulators. Typically, the buried insulating layer 12A is comprised of silicon dioxide. The thickness of the buried insulating layer 12A is typically from 50 nm to 200 nm, with a thickness from 100 nm to 150 nm being more typical. The buried insulating layer 12A may be a continuous layer between the top semiconductor layer and the bottom semiconductor layer, or be composed of multiple layers.

The SOI substrate 12 is formed utilizing conventional processing known to those skilled in the art. For example, the SOI substrate can be made by a bonding process or a process known as SIMOX (Separation by Ion Implantation of Oxygen). If needed, one of the above mentioned thinning methods can be used to thin the top semiconductor layer 12B such that the final thickness of the top semiconductor layer 12B is within the thickness regime mentioned above.

After providing the SOI substrate 12 including the top Si-containing layer 12B, alternating layers of a sacrificial material 15' and a semiconductor material 15 are formed over the top semiconductor layer 12B of the SOI substrate 12. Each layer of sacrificial material 15' that is formed may comprise a crystalline material including, for example SiGe. This layer may optionally be doped to form, for example, n+ or p+ doped SiGe. P and As are examples of n-type dopants that can be employed, while B is an example of a p-type dopant that can be employed. The dopant concentration with the layers of sacrificial material 15' is typically from $10^{19}$ atoms/cm$^3$ to $10^{22}$ atoms/cm$^3$; dopant concentration in these layers would typically be targeted to be as high as possible while maintaining crystallinity. The doping may be performed in-situ (i.e., during the deposition of an individual layer of sacrificial material) or ex-situ (after deposition of an individual layer of sacrificial material), with ex-situ doping required for CMOS, since n and p-type doped regions would be needed where nFETs and pFETs, respectively, are ultimately desired. Each layer of sacrificial material 15' that is formed is deposited utilizing an epitaxial growth process. As such, the sacrificial material 15' should be single crystalline and have crystalline dimensions close to that of layers 12B and 15. Typically, the thickness of each layer of sacrificial material would be from 5 nm to 20 nm; to minimize parasitic capacitance, the thickness should be as small as possible while still leaving enough room for two layers of gate dielectric and one layer of a gate conductor to fit in the gap formed once the sacrificial layer is removed later on in the processing.

Each layer of semiconductor material 15 that is formed may comprise the same or different semiconductor material as the top semiconductor layer 12B of the SOI substrate 12. Typically, each layer of semiconductor material 15 that is formed is comprised of a Si-containing semiconductor, with Si being highly preferred. Each layer of Si-containing material 15 that is formed is deposited utilizing an epitaxial growth process. As such, each layer of semiconductor material is single crystalline as well. The thickness of each layer of semiconductor material 15 that is formed is typically from 5 nm to 20 nm, with a thickness similar to that of layer 12B being preferred for uniform FET characteristics.

The epitaxial growth processes used in forming each layer of semiconductor and each layer of sacrificial material are performed below 800° C., with a temperature of below 650° C. being more preferred. The growth processes can be formed without breaking vacuum between each grown layer, or vacuum can be broken between the growth of each layer to enable extra processing such as ex-situ doping of the sacrificial layers for CMOS. Preferably, the vacuum is not broken during the growth of the alternating layers of sacrificial material and semiconductor material. Notwithstanding whether the vacuum is broken or non-broken during growth of layers 15 and 15', a purge step is typically performed between each successive layer formation.

The growth pressure employed in forming each of layers 15 and 15' should be below 100 torr, with a growth pressure below 50 torr being more preferred.

It is noted that due to the processing steps mentioned above each of layers 15 has a height variation that is less than or equal to about 5%. Height variation of layer 12B will depend on the SOI substrate and thinning method used, but should be able to be maintained at or below 2 nm. It is further noted that the height variation for each of layers 12B and 15 will provide semiconductor nanowires that also have this same height variation. It is even further noted that the thickness of each layer of sacrificial material determines the distance that each vertically spaced apart semiconductor nanowire (to be subsequently formed) will be separated by.

The number of layers of sacrificial material 15' and semiconductor material 15 that is formed atop the top semiconductor layer 12B of the SOI substrate 12 may vary. It is noted that the combination of the top semiconductor 12B, the layers of sacrificial material 15' and the layers of semiconductor material 15 form a material stack that will be used to define the location of semiconductor nanowires in the Z-direction.

After forming the alternating layers of sacrificial material and semiconductor material, a first hard mask 16 is formed atop the uppermost layer of semiconductor material. The first hard mask 16 should be chosen for mechanical properties and process considerations such as etch selectivities to spacer material 30 (to be subsequently formed), second hard mask 18 (also to be subsequently formed), and the fin etching process employed. In one embodiment, the first hard mask 16 is silicon dioxide. The first hard mask 16 is formed by a conventional deposition process including, but not limited to chemical vapor deposition (CVD), plasma enhanced chemical vapor deposition (PECVD), atomic layer deposition (ALD), and chemical solution deposition could be used. The thickness of the first hard mask 16 may vary depending on the processing technique used to fabricate the same. Typically, however, the first hard mask 16 has a thickness from 5 nm to 40 nm, with a thickness from 10 nm to 20 nm being more typical.

Following the formation of the first hard mask 16, a trench isolation region (not specifically shown) is formed by removing non-active regions of the first hard mask 16, the alternating layers of sacrificial material 15' and semiconductor material 15 as well as the top semiconductor layer 12B of the SOI substrate 12, stopping on a surface of the buried insulating layer 12A. The trench isolation region is first formed by lithography and etching. The lithographic step includes applying a photoresist (not shown) atop the first hard mask 16, exposing the photoresist to a desired pattern, e.g., a trench pattern, of radiation, and developing the exposed resist utilizing a conventional resist developer. The trench pattern is then transferred into at least the first hard mask 16 utilizing an etching process including one of dry etching and chemical etching. When dry etching is used, one of reactive ion etching (RIE), ion beam etching, plasma etching and laser ablation is employed. When chemical etching is employed, a chemical etchant that selectively etches the pad oxide relative to the exposed and developed photoresist is employed. In some cases and after the trench pattern has been transferred into the first hard mask 16, the exposed and developed photoresist is stripped utilizing a conventional stripping process, such as ashing. In other cases, the exposed and developed photoresist remains on the structure during the transfer of the trench pattern into the alternating layers of sacrificial material 15' and the semiconductor material 15 as well as the top semiconductor layer 12B. The transfer of the trench pattern from the patterned first hard mask 16 to layers 15', 15 and 12B includes one of the etching processes mentioned above.

Following the definition of the trench pattern into first hard mask 16 and layers 15', 15 and 12B, a nitride liner 19 is formed at least on the trench sidewalls utilizing a conventional deposition process such as, for example, CVD, PECVD and ALD. The nitride liner 19 typically has a thickness from 1 nm to 20 nm, with a thickness from 1 nm to 5 nm being even more typical.

Next, a trench dielectric material (not shown) is formed into the remaining trench region provided above and thereafter the structure is subjected to a conventional planarization process including one of CMP and grinding. The trench dielectric material (which is not shown in the drawings) is comprised of a conventional trench dielectric material including, for example, silicon dioxide. The trench dielectric may be formed utilizing known deposition processes. For example, a high-density plasma oxide deposition process or deposition utilizing tetraethylorthosilicate (TEOS) can be employed.

It is noted that during the formation of the trench isolation region, the hard mask 16 as well as layers 15, 15' and 12B are patterned. It is further noted that patterned layers 15, 15' and 12B are collectively referred to herein as a patterned material stack 14.

Next, a second hard mask 18 is formed atop the structure including the patterned first hard mask 16, the nitride liner 19 and trench dielectric material (not shown). The second hard mask 18 should be chosen for mechanical properties and etch resistivities compared to first hard mask 16, patterned material stack 14, and spacer material 30 (to be subsequently formed). In one embodiment of the invention, silicon nitride could be used as the second hard mask 16. The second hard mask 18 is formed utilizing a conventional deposition process, including those mentioned above in respect to first hard mask 16. The thickness of the second hard mask 18 may vary depending on the process used to form the same. Typically, the second hard mask 18 has a thickness from 5 nm to 30 nm, with a thickness from 15 nm to 20 nm being even more typical.

Figure 2:
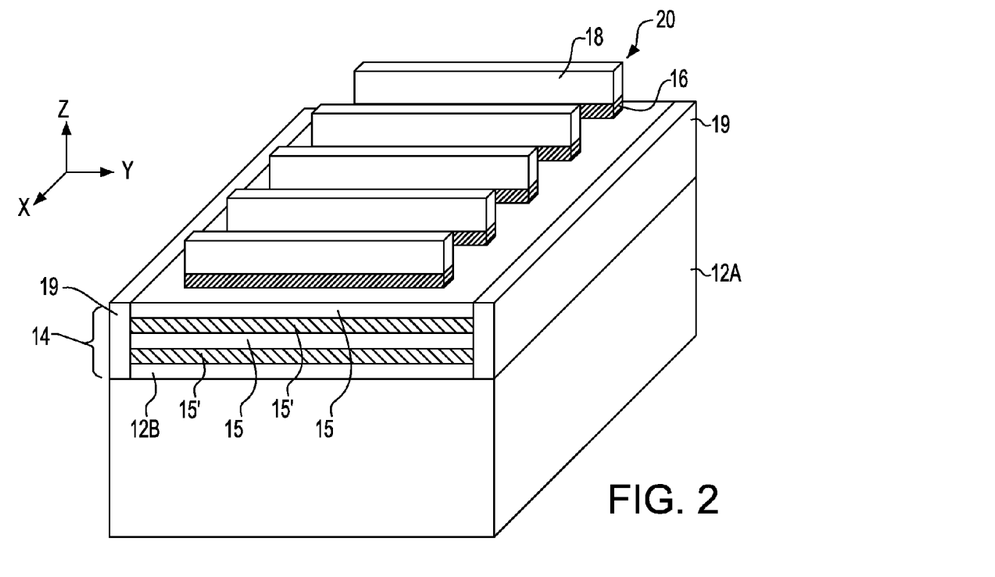
FIG. 2 is a pictorial representation (through a 3D view) illustrating the initial structure of FIG. 1 after forming a plurality of patterned hard masks atop the at least one patterned material stack.

Reference is now made to FIG. 2 which illustrates the structure that is formed after patterning and etching the initial structure 10 shown in FIG. 1 to include a plurality of patterned hard masks 20 located atop the uppermost layer of semiconductor material of patterned material stack 14. Each patterned hard mask 20, which includes a lower layer of the first hard mask 16 and an upper layer of the second hard mask 18, will define the location of the semiconductor nanowires in the X-direction. The patterning step includes a similar lithographic step as mentioned above except that a mask pattern, instead of a trench pattern, is formed into the applied photoresist and then transferred into unprotected portions of the second hard mask 18 and hard mask 16.

Etching is then performed to transfer the pattern from the patterned photoresist into the underlying pad layers (i.e., layers 18 and 16, respectively). The pattern may first be transferred to the second hard mask 18 and then into the underlying first hard mask 16 utilizing the same or different etching step. The patterned photoresist may be removed after transferring the pattern into the second hard mask 18 or after transferring the pattern from the second hard mask 18 into the underlying the first hard mask 16. A conventional ashing process can be used to strip the patterned resist from the structure. Etching may be performed utilizing dry etching (i.e., reactive ion etching, ion beam etching, plasma etching or laser ablation), wet chemical etching or any combination thereof. In some embodiments, the etching used to transfer the pattern into the second hard mask 18 and the first hard mask 16 includes dry etching (i.e., reactive ion etching, ion beam etching, plasma etching or laser ablation). As illustrated in FIG. 2, the etching process stops atop an uppermost layer of semiconductor material of the patterned material stack 14.

It is noted that each patterned hard mask 20, which may be referred to as a fin mask, is configured to have a pitch, e.g., a distance between each adjacent patterned hard masks 20, of less than 200 nm, typically between 10 nm and 200 nm, and with a distance between each adjacent patterned hard masks 20 of between 40 nm and 50 nm being even more typical. To maximize layout density and minimize parasitic capacitance, the pitch should be made as small as possible within patterning and processing limits. To achieve pitches smaller than what can be defined by direct lithography, a pitch doubling technique such as sidewall image transfer or double patterning/double etching could be used. The width of each patterned hard mask 20 is typically less than 40 nm, more typically from 5 nm to 40 nm, and with a width from 5 nm to 10 nm being even more typical. It is further noted that the pitch and width of each patterned hard mask 20 will determine the pitch and width of each fin and subsequently each semiconductor nanowire.

At this point of the inventive process, exposed surfaces of the patterned material stack 14 can be subjected to a thermal oxidation process which forms a thin (on the order of about 5 nm or less) oxide layer 22 on the exposed upper surface of the patterned material stack 14. The thin oxide layer 22 serves as an etch stop layer during subsequent processing steps of the invention. The resultant structure including the thin oxide layer 22 is shown, for example, in FIG. 3.

Figure 3:
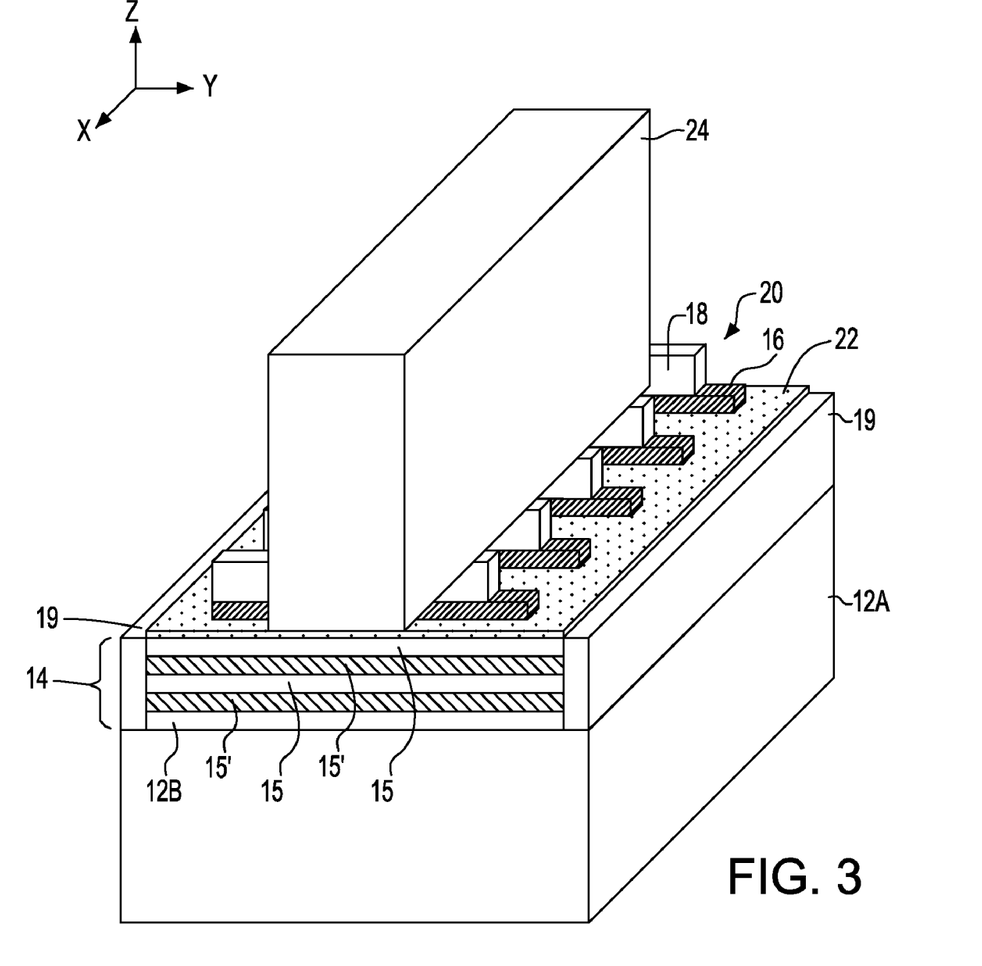
FIG. 3 is a pictorial representation (through a 3D view) illustrating the structure of FIG. 2 after forming a dummy gate over a central portion of each of the plurality of patterned hard masks.

Next, a dummy gate 24 is formed providing the structure also illustrated in FIG. 3. As shown, the dummy gate 24 is formed in a central portion across each of the patterned hard masks 20. The location of the dummy gate 24, which is orthogonal to the underlying patterned hard masks 20, defines the location of the nanowire channels in the Y-direction as well as the location of the gate. The dummy gate 24 employed in the present invention comprises polysilicon or other related sacrificial material. The dummy gate 24 is formed by first providing a blanket layer atop the structure shown in FIG. 2 utilizing a conventional deposition process including, for example, chemical vapor deposition, plasma enhanced chemical vapor deposition or chemical solution deposition. The blanket layer of dummy gate material is then patterned by lithography and etching to form dummy gate 24 as shown in FIG. 3.

At this point of the inventive process, a top-down implant (not shown) may optionally be used to dope the upper layer(s) of semiconductor material of patterned material stack 14 with either an n-type dopant or a p-type dopant. The conditions for this implant are well known to those skilled in the art and may vary depending on the type of dopant species employed.

Figure 4:
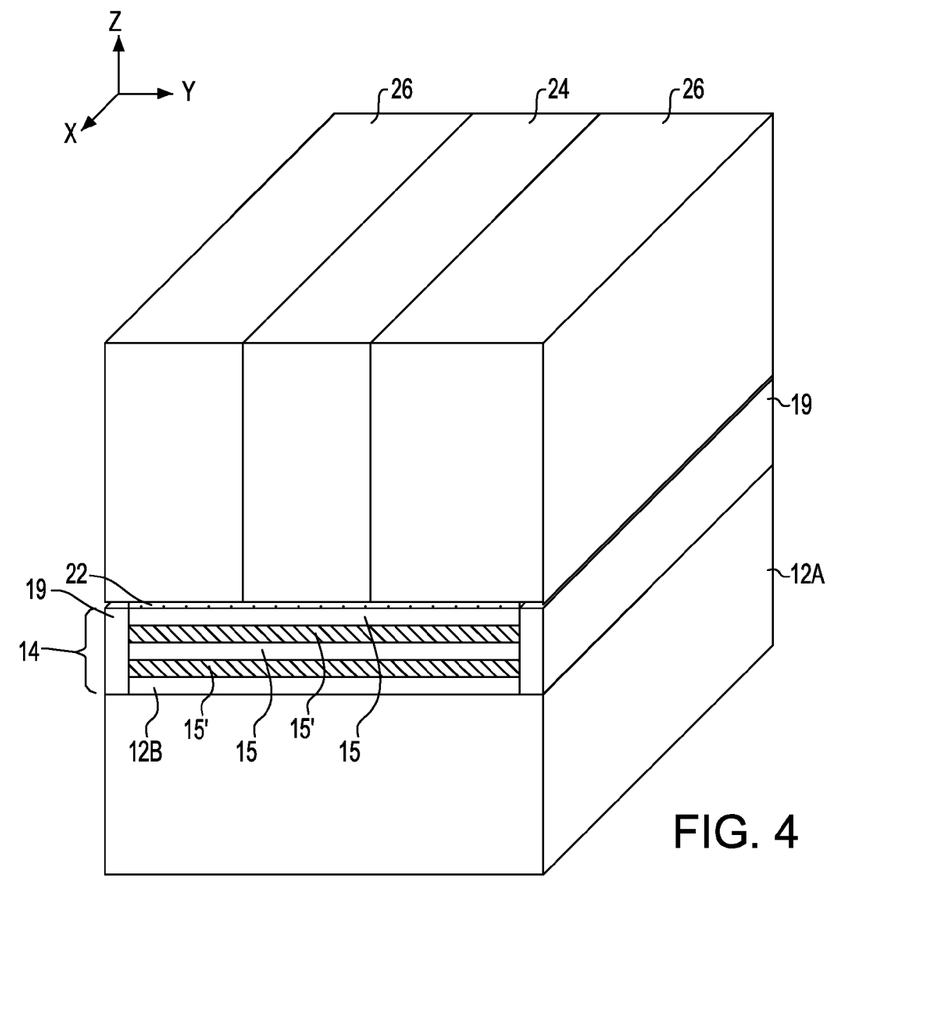
FIG. 4 is a pictorial representation (through a 3D view) illustrating the structure of FIG. 3 after forming a sacrificial material layer adjacent said dummy gate and planarization; the planarization provides a sacrificial material layer surrounding the dummy gate.

FIG. 4 illustrates the structure that is formed after filling the structure shown in FIG. 3 with a sacrificial material layer 26 and planarization. The sacrificial material layer 26 which surrounds the dummy gate 24 may comprise any suitable filler material such as, for example, $SiO_2$ or silicon nitride. The filling step includes a conventional deposition process including for example, a high-density plasma deposition process. The planarization step includes chemical mechanical polishing (CMP) and/or grinding. It is noted that in the remaining drawings layer 22 is not shown for sake of clarity.

Figure 5:
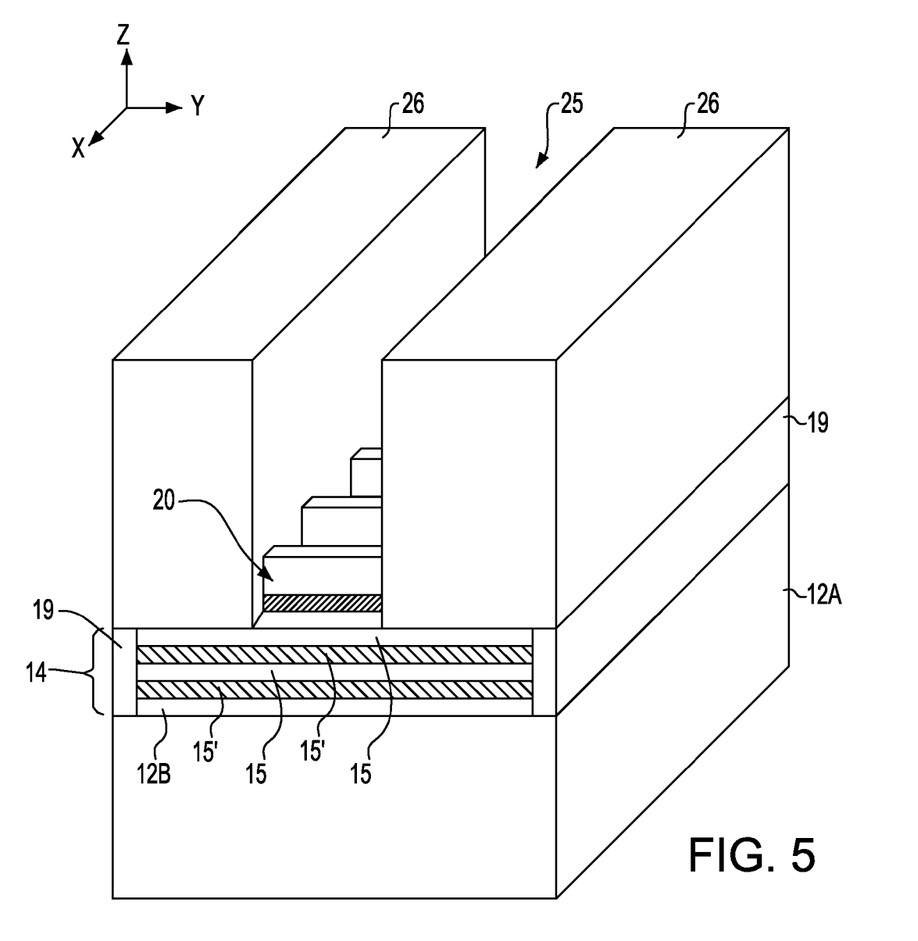
FIG. 5 is a pictorial representation (through a 3D view) illustrating the structure of FIG. 4 after removing the dummy gate to form a trench between the sacrificial material layer that previously surrounded the dummy gate.
Figure 6:
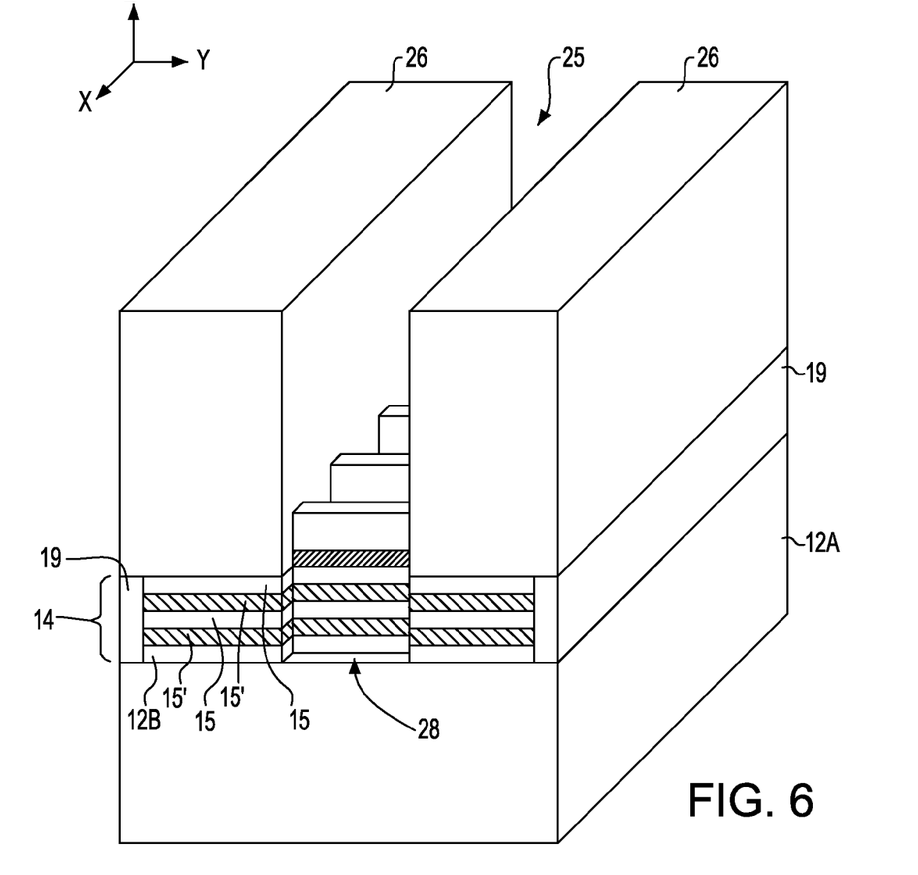
FIG. 6 is a pictorial representation (through a 3D view) illustrating the structure of FIG. 5 after etching a plurality of fins into the at least one patterned material stack including the alternating layers of semiconductor material and sacrificial material.

Next, and as illustrated in FIG. 5, the dummy gate 24 is removed from the structure utilizing a chemical etching process (such as chemical down stream or KOH etching) or reactive ion etching. The etching process stops atop the patterned hard masks 20 and the thin chemical oxide layer 22. The removal of the dummy gate 24 forms a trench 25 between neighboring portions of the sacrificial layer material 26. Trench 25 distinguishes a channel region from regions in which the source and drain (hereinafter source/drain) regions will be subsequently formed. Note that the regions in which the source/drain regions will be subsequently formed are protected by sacrificial material layer 26 at this point of the inventive method.

After removing the dummy gate 24 from the structure, exposed portions of the patterned material stack 14 within trench 25 are removed utilizing an etching step that anisotropically transfers the pattern formed by the sacrificial material layer 26 and patterned hard masks 20 into the patterned material stack 14. An examples of such an etch would be a reactive ion etching process. The resultant structure is shown, for example, in FIG. 6. It is noted that the remaining portions of the patterned material stack 14, protected by patterned hard masks 20 forms a plurality of fins 28 of the inventive structure.

Figure 7:
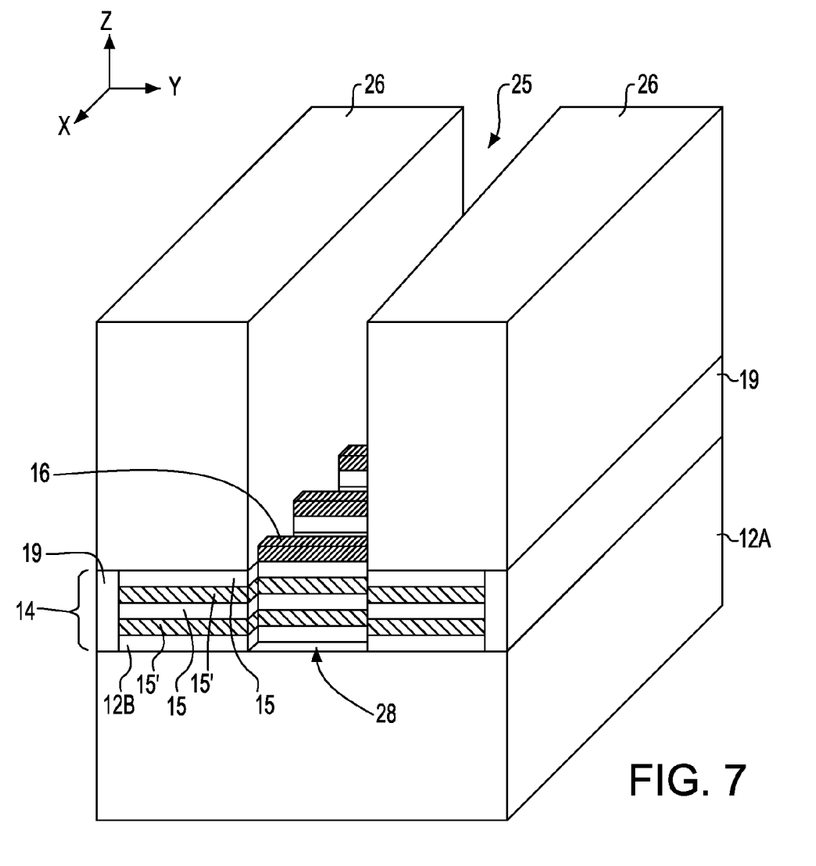
FIG. 7 is a pictorial representation (through a 3D view) illustrating the structure of FIG. 6 after removing an upper layer from each of the patterned hard masks that lays atop each fin in the trench.

Next, any remaining second hard mask 18 (e.g., upper portion of each patterned hard mask 20) may be removed within trench 25 utilizing an etching process that selectively removes the second hard mask 18 as compared to the first hard mask 16 and/or semiconductor material. Ideally, however, the thickness of the second hard mask 18 should have been chosen such that it is mostly consumed during the previous fin etch, so there should not be much left on the structure at this point. The resultant structure is shown in FIG. 7. It is noted that at this point of the inventive method the first hard mask 16 of the patterned hard mask 20 remains atop each fin 28.

Figure 8:
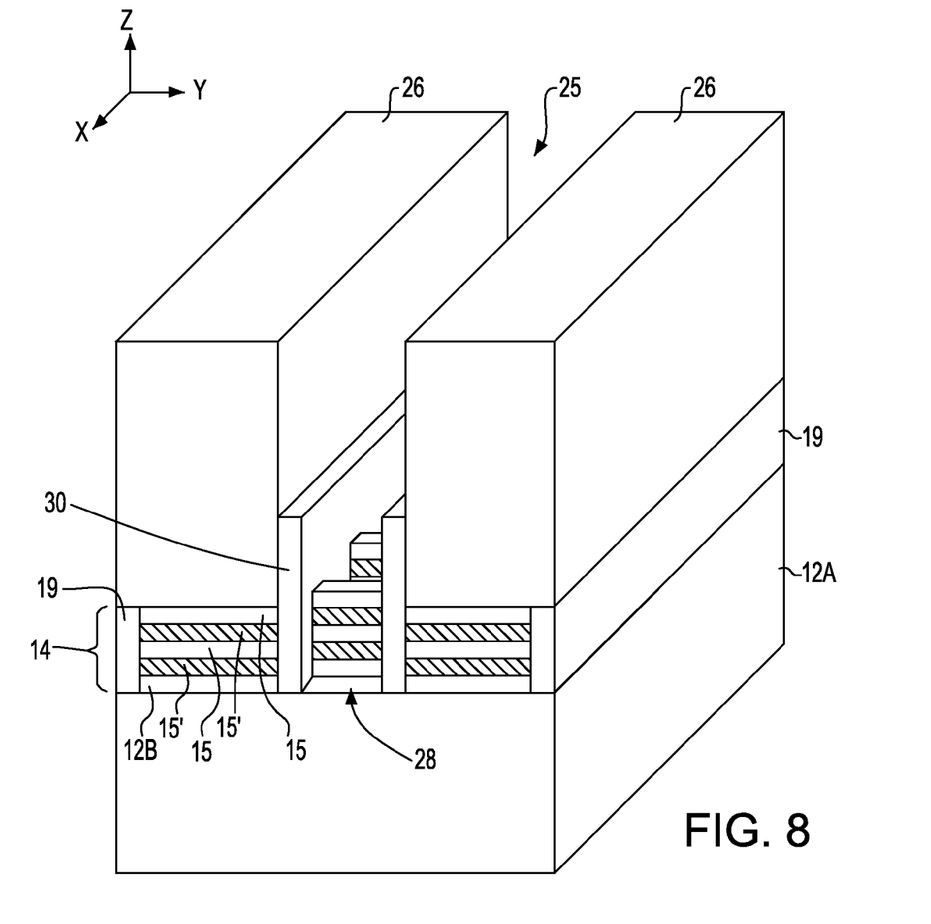
FIG. 8 is a pictorial representation (through a 3D view) illustrating the structure of FIG. 7 after spacer formation within the trench.

After removing the second hard mask 18 of the patterned hard mask 20 from within trench 25, a spacer 30, as shown in FIG. 8, may optionally be formed by deposition and etching. The spacer 30 may comprise any insulating material including, for example, a nitride, an oxynitride and/or an oxide. In one embodiment of the invention, the spacer 30 is comprised of a nitride and/or oxynitride. The etching process used in forming the spacer 30 is typically performed utilizing conditions that provide for a large over etch such that no spacer material remains on the exposed sidewalls of each fin 28. That is, the spacer 30 fully covers the sidewalls of the trench 25 and is completely absent on each fin 28. The amount of over etch depends on the height of the fin 28, and is expected to be much larger than the time required to remove spacer material from planar regions, anywhere from 100 to 300% or even more. This spacer reduces parasitic capacitance between the gate and the source/drain landing pads, but is not vital to the switching ability of the inventive nanowire FET.

After forming the spacer 30, each layer of sacrificial material 15' from each fin 28 is selectively removed to release the layers of semiconductor materials, e.g., layers 12B and 15. The released layers of semiconductor material, e.g., 12B and 15 are now referred to herein as semiconductor nanowires 32. Each individual semiconductor nanowire 32 within trench 25 represents a channel, e.g., semiconductor nanowire channel, of the inventive structure. The resultant structure including the now released semiconductor nanowires 32 is shown, for example, in FIG. 9. It is noted that the structure shown in FIG. 9 includes a plurality of vertical stacked and spaced apart semiconductor nanowires 32, e.g., nanowire mesh, that are located within trench 25.

Figure 9:
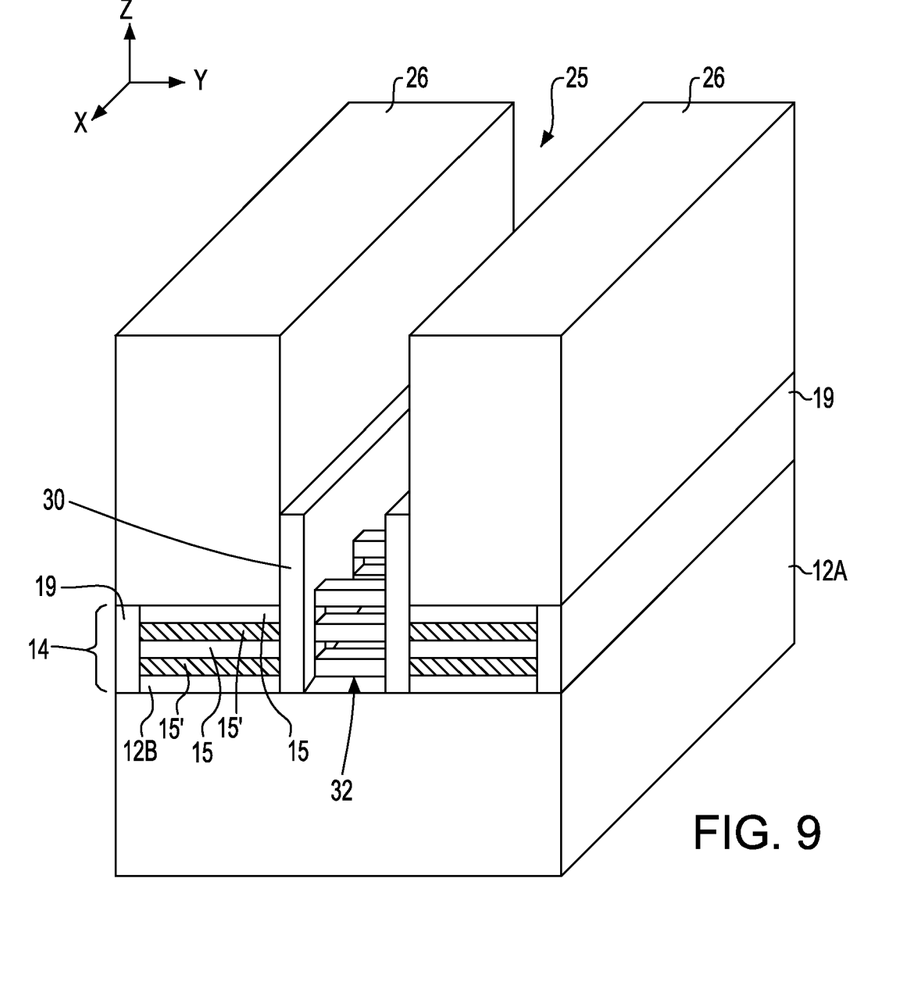
FIG. 9 is a pictorial representation (through a 3D view) illustrating the structure of FIG. 8 after removing the layers of sacrificial material from the fins to provide a plurality of vertically stacked and vertically spaced apart semiconductor nanowires in the trench.

The removal of the layers of sacrificial material 15' from each fin 28 is achieved, in some embodiments, chemically utilizing an etchant that exploits the lower oxidation potential of the layers of sacrificial material 15' compared to the layers of semiconductor material 15 and 12B. Examples of such etchants include, but are not limited to a 1:2:3 mixture of $HF:H_2O_2:CH_3COOH$, or a mixture of $H_2SO_4$ and $H_2O_2$.

In yet other embodiments of the invention, the selective removal of the layers of sacrificial material 15' from each fin 28 can be achieved using a dry etching process such as $O_2$ plasma etching or plasma chemistries typically used for etching.

Note that a spacer is not formed on the source/drain region sidewalls where the sacrificial material 15' was in the fins 28 before removal. To reduce parasitic capacitance between the gate and the source/drain landing pads at these points, a spacer may be formed selectively on the exposed sacrificial material 15'. For example, in the case of doped SiGe sacrificial material 15' and undoped Si nanowires 32, a low temperature oxidation process such as hyperbaric oxidation (10 atmospheres) at 650° C. could be used to selectively oxidize exposed SiGe. This specific process shows a 70 times increase on oxidation rate for 25 percent doped SiGe compared to a Si control, allowing the formation of an oxide spacer on the source/drain landing pads without oxidation of the nanowire channels.

At this point of the present invention, a solid source diffusion anneal may be performed to dope each of the remaining layers of semiconductor material, e.g., 12B and 15, outside trench 25, e.g., within the source/drain regions, with dopant from the remaining layers of sacrificial material 15'. The anneal can also be used to activate the dopants after outdiffusing the same from the remaining layers of sacrificial material 15' into the remaining layers of semiconductor material, e.g., layers 12B and 15, that are present outside trench 25. Alternately, a high temperature diffusionless anneal such as laser anneal or flash anneal could be used to activate the dopants once diffused into the layers 12B and 15.

Figure 10A:
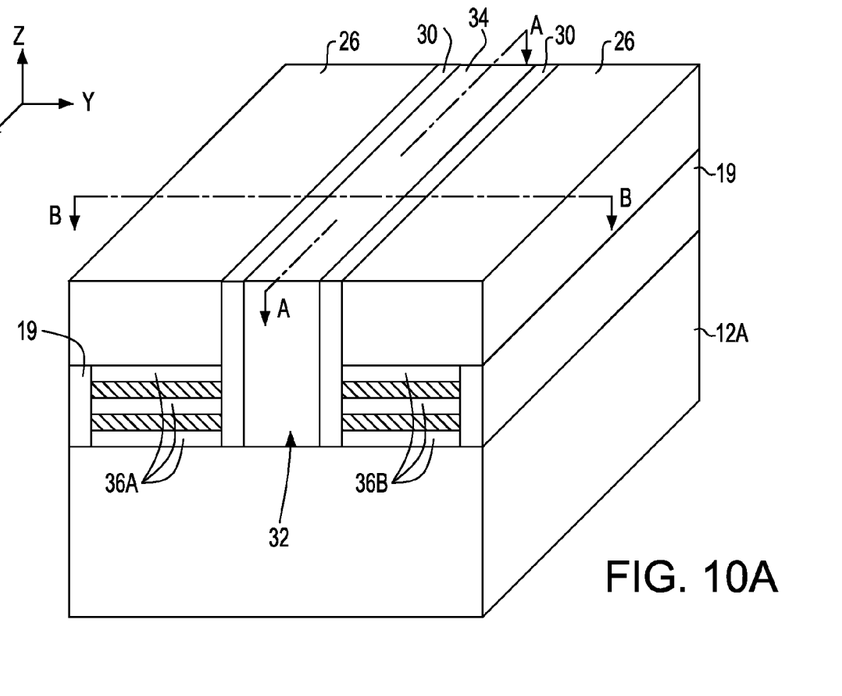
FIG. 10A is a pictorial representation (through a 3D view) illustrating the structure of FIG. 9 after formation of a gate region within the trench and at least on the plurality of vertically stacked and vertically spaced apart semiconductor nanowires.
Figure 10B:
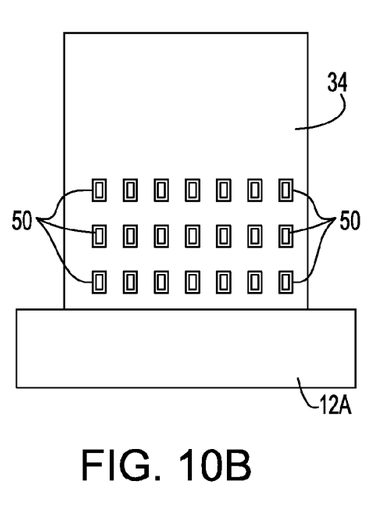
FIG. 10B is a cross sectional view of the structure through line A-A shown in FIG. 10A.

When employed, the solid source diffusion anneal is performed at a temperature of 800° C. or greater, with a temperature of from 850° C. to 1150° C. being even more typical. This anneal is preferentially performed in an inert ambient including one of helium, argon, neon, xenon and krypton. The semiconductor diffusion regions that are formed outside trench 25 are shown in FIG. 10A. Specifically, some of the diffusion regions can be used as source regions 36A, while other diffusion regions are drain regions 36B; a region can also be shared between two devices, acting as a source region for one FET and a drain region for another FET. As illustrated in FIG. 10A, one end segment of each vertically stacked and vertically spaced apart semiconductor nanowires 32, e.g. nanowire channels, is connected to a source region 36A and another end segment of each vertically stacked and vertically spaced apart semiconductor nanowires 32 is connected to a drain region 36B. As such, each semiconductor wire and the corresponding source and drain region are of unitary constructions and no material interface is located between them.

Note that the differential chemical oxidation of exposed 15' material described above may be performed at this point instead of before the solid source diffusion and/or activation anneal.

At this point of the inventive process, a gate dielectric (not specifically shown in the drawings) can be formed into the trench 25 utilizing a conventional deposition process or a thermal growth process. The gate dielectric may be a low k gate dielectric, i.e., an insulating material having a dielectric constant of less than silicon dioxide; silicon dioxide; or a high k gate dielectric, i.e., an insulator having a dielectric constant greater than silicon dioxide. The gate dielectric is typically located between the semiconductor nanowires 32 and the gate material to be subsequently formed.

Next, a replacement gate, i.e., gate conductor, 34 is formed over each of the semiconductor nanowires 32 by filling trench 25 with a gate material. Once the gate material is filled into the trench 25, planarization such as, for example, chemical mechanical polishing, is used to planarize the gate utilizing the sacrificial material layer 26 as an etch stop. Suitable gate materials include but are not limited to, one or more layer of materials such as polysilicon, silicon germanium, an elemental metal, an alloy of an elemental metal, a metal nitride and/or a metal silicide.

The gate region, which includes the gate dielectric and the gate conductor mentioned above, is located over at least a portion of the plurality of vertically stacked and vertically spaced apart semiconductor nanowires 32. The source regions 36A and the drain regions 36B, which are still protected with the sacrificial material layer 26, are self-aligned with the gate region.

After forming the gate region, the structure is subjected to a planarization process, stopping atop the upper surface of spacer 30 that was previously formed in each trench. It is noted that the spacer 30 is located between each vertically stacked and vertically spaced apart semiconductor nanowire 32 and the spacer 30 is position between the gate region and the source regions 36A and drains regions 36B of the inventive structure. This reduces parasitic capacitance.

In some embodiments (not shown), the sacrificial material layer 26 can be removed from the structure utilizing a selective etching process, and traditional microfabrication processes such as silicide formation, contact via formation, and metallization of multiple levels of metal wiring can proceed. Alternately, silicidation of the source/drain landing pads can be done after patterning of the dummy gate 24 but before removal of the sacrificial material layer 26. This, however, would require a silicidation material that can withstand the thermal budget of the dopant activation anneal.

Figure 10C:
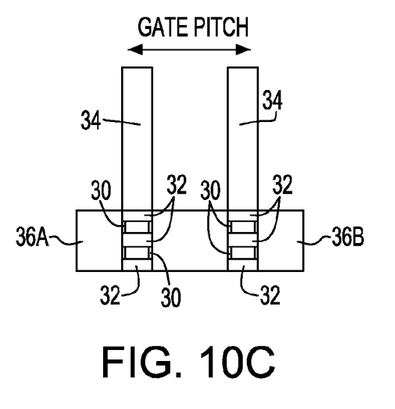
FIG. 10C is a cross sectional view of the structure through line B-B shown in FIG. 10A.

It is observed that in the inventive structure shown in FIG. 10A increased channel width density is obtained since the structure includes vertically stacked and vertically spaced apart semiconductor nanowires 32. The vertically stacked and spaced apart arrangement yields the conducting surface 50 shown in FIG. 10B. It is further observed that tight gate pitch is enabled since the gate-to-landing pad structure is self-aligned as shown in FIG. 10C.

It is even further observed that the inventive process described above, which utilizes solid-source doping, enables better vertical uniformity in junction profiles as compared to FinFET structures that are fabricated with top-down implants. As such, the height of the inventive device (i.e., the number of stacked semiconductor nanowires) is not limited by the ability to define source and drain junctions from a top-down implant. It is yet further observed that the inventive structure has reduced gate-to-source/drain capacitance as compared to prior art FinFET structures since during the inventive process a thin, self-limiting interfacial oxide is formed on the undoped semiconductor nanowires.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:

providing a plurality of patterned hard masks atop a patterned material stack including alternating layers of semiconductor material and sacrificial material, wherein the bottommost layer of the patterned material stack is a top semiconductor layer of a semiconductor substrate;

forming at least one dummy gate over a central portion of each of said plurality of patterned hard masks;

forming a sacrificial material layer abutting said at least one dummy gate;

removing the at least one dummy gate to form at least one trench in the sacrificial material layer, each trench centered over the central portion of the plurality of patterned hard masks, that distinguishes a fin region from source and drain regions;

etching a plurality of fins within said at least one trench in the patterned material stack using the plurality of patterned hard masks as an etch mask;

removing the plurality of patterned hard masks and each layer of sacrificial material within said at least one trench to form a plurality of vertically stacked and vertically spaced apart semiconductor nanowires within said at least one trench; and filling the at least one trench with at least a gate region.

2. The method of claim 1 wherein said semiconductor substrate is a semiconductor-on-insulator and said bottommost layer of said patterned material stack is located on a buried insulating layer.

3. The method of claim 1 wherein said alternating layers of sacrificial material and semiconductor material excluding said top semiconductor layer are formed by an epitaxial growth process, said epitaxial growth process is performed at a temperature of below 800° C. and at a pressure below 100 torr.

4. The method of claim 3 wherein each of said layers of sacrificial materials are semiconductor materials that are doped in-situ during said epitaxial growth process.

5. The method of claim 1 further comprising forming a spacer within said at least one trench between said removing the plurality of patterned hard masks and removing each layer of sacrificial material within said at least one trench, said spacer is formed by deposition and etching, and said etching is performed utilizing a large over etch such that no spacer material remains on the sidewalls of each fin.

6. The method of claim 1 wherein said removing each layer of sacrificial material is performed chemically utilizing an etchant that exploits the lower oxidation potential of the layers of sacrificial material compared to the layers of semiconductor material.

7. The method of claim 1 wherein said removing each layer of sacrificial material is performed utilizing a plasma etching process.

8. The method of claim 1 wherein said removing each layer of sacrificial material is performed using a wet or dry oxidation process that is performed at a temperature of less than 750° C.

9. The method of claim 1 further comprising performing a solid source diffusion anneal between said removing the plurality of patterned hard masks and each layer of sacrificial material within said at least one trench and filling the at least one trench with at least a gate region, said solid source diffusion anneal forms source regions and drain regions in said layers of semiconductor material outside said at least one trench.

10. The method of claim 9 wherein said solid source diffusion anneal is performed in an inert ambient at a temperature of 800° C. or greater.

11. The method of claim 1 further comprising performing a differential chemical oxidation process between said removing the plurality of patterned hard masks and each layer of sacrificial material within said at least one trench and filling the at least one trench with at least a gate region to form at least an interfacial oxide on said semiconductor nanowires.

12. The method of claim 11 wherein said differential chemical oxidation process is performed in an oxygen-containing ambient.

13. The method of claim 1 wherein each semiconductor nanowire has a pitch of less than 200 nm and a width of less than 40 nm.

* * * * *